(12) United States Patent
Wallis et al.

(10) Patent No.: US 11,942,935 B2
(45) Date of Patent: Mar. 26, 2024

(54) PROGRAMMABLE LOGIC BLOCK WITH MULTIPLE TYPES OF PROGRAMMABLE ARRAYS AND FLEXIBLE CLOCK SELECTION

(71) Applicant: STMICROELECTRONICS (ROUSSET) SAS, Rousset (FR)

(72) Inventors: Mark Wallis, Mouans Sartoux (FR); Jean-Francois Link, Trets (FR); Joran Pantel, Marseilles (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 0 days.

(21) Appl. No.: 17/861,067

(22) Filed: Jul. 8, 2022

(65) Prior Publication Data

US 2024/0014819 A1   Jan. 11, 2024

(51) Int. Cl.
  *H03K 19/17724* (2020.01)
  *H03K 19/173* (2006.01)
  *H03K 19/17736* (2020.01)
  *H03K 19/20* (2006.01)

(52) U.S. Cl.
  CPC ... *H03K 19/17724* (2013.01); *H03K 19/1737* (2013.01); *H03K 19/1774* (2013.01); *H03K 19/17744* (2013.01); *H03K 19/20* (2013.01)

(58) Field of Classification Search
  None
  See application file for complete search history.

(56) References Cited

U.S. PATENT DOCUMENTS

| | | | |
|---|---|---|---|
| 5,046,035 A | * | 9/1991 | Jigour ............... H03K 19/17716 326/39 |
| 5,144,166 A | | 9/1992 | Camarota et al. |
| 5,614,844 A | * | 3/1997 | Sasaki ............. H03K 19/17792 326/110 |
| 5,835,998 A | | 11/1998 | Pedersen |
| 6,011,407 A | | 1/2000 | New |
| 6,057,708 A | | 5/2000 | New |
| 6,084,447 A | | 7/2000 | Graf, III |
| 6,184,707 B1 | | 2/2001 | Norman et al. |
| 6,329,839 B1 | | 12/2001 | Pani et al. |
| 6,614,314 B2 | | 9/2003 | d'Haene et al. |
| 6,651,231 B2 | | 11/2003 | Morikawa |
| 6,686,769 B1 | | 2/2004 | Nguyen et al. |
| 6,748,577 B2 | | 6/2004 | Bal |
| 7,003,423 B1 | | 2/2006 | Kabani et al. |
| 7,218,133 B2 | | 5/2007 | Lewis et al. |
| 8,334,712 B2 | | 12/2012 | Klein et al. |

(Continued)

OTHER PUBLICATIONS

U.S. Appl. No. 17/733,934, filed Apr. 29, 2022.
U.S. Appl. No. 17/827,515, filed May 27, 2022.

*Primary Examiner* — Anh Q Tran
(74) *Attorney, Agent, or Firm* — Seed IP Law Group LLP (57) ABSTRACT

An integrated circuit includes a programmable logic block. The programmable logic block includes a programmable logic array (PLA) and a field programmable gate array (FPGA). The PLA includes logic cells having a first architecture. The FPGA includes logic cells having a second architecture more complex than the first architecture. The programmable logic block includes an interface coupled to the PLA and the FPGA. An integrated circuit may also include circuitry for selecting one of plurality of clock signals for logic cells of a PLA.

16 Claims, 6 Drawing Sheets

(56) References Cited

U.S. PATENT DOCUMENTS

| | | |
|---|---|---|
| 8,664,975 B1 | 3/2014 | Gao et al. |
| 8,675,681 B2 | 3/2014 | Hill et al. |
| 8,838,852 B1 | 9/2014 | Sullam et al. |
| 8,913,601 B1 | 12/2014 | Kaviani |
| 8,977,882 B2 | 3/2015 | Garg et al. |
| 9,106,235 B2 | 8/2015 | Dally |
| 9,577,648 B2 | 2/2017 | Shivaram et al. |
| 9,690,278 B1 | 6/2017 | Chen et al. |
| 9,787,311 B1 | 10/2017 | Ooi |
| 10,587,271 B2 | 3/2020 | Wang et al. |
| 2013/0093461 A1 | 4/2013 | Voogel et al. |
| 2016/0182054 A1* | 6/2016 | Westwick .......... H03K 19/1737 326/38 |
| 2016/0261272 A1 | 9/2016 | Ikeda et al. |
| 2017/0215745 A1 | 8/2017 | Felix et al. |
| 2017/0262567 A1 | 9/2017 | Vassiliev |
| 2019/0379380 A1 | 12/2019 | Atsatt |
| 2020/0344180 A1 | 10/2020 | Pope et al. |

\* cited by examiner

PROGRAMMABLE LOGIC BLOCK WITH MULTIPLE TYPES OF PROGRAMMABLE ARRAYS AND FLEXIBLE CLOCK SELECTION

BACKGROUND

Technical Field

The present disclosure is related to integrated circuits, and more particularly, to integrated circuits including programmable logic arrays (PLA).

Description of the Related Art

Many integrated circuits include a programmable logic array (PLA). A PLA may include programmable logic cells connected to each other and to the PLA input/output signals by a programmable interconnect. The interconnect may include multiplexers which are controlled by configuration registers. A logic cell can be programmed to combine one or more of its inputs to generate a single output, whose state is a Boolean function of the input states. The output state may or may not be captured by a flip-flop or latch.

In order to implement synchronous systems efficiently, a PLA may include flip-flops that can store the state of logic cell outputs on a rising or falling edge of a clock signal. The same clock signal is generally supplied to all flip-flops within a synchronous system. This allows synthesis tools to estimate propagation delays and avoid unpredictable states due to flip-flop inputs changing at the same time as the clock. However, traditional PLA systems do not allow flexibility in selecting a clock signal for a PLA. The result is static and inflexible PLA systems.

Furthermore, traditional systems include either a low complexity PLA or a high complexity FPGA. These traditional systems do not provide flexibility to users.

All of the subject matter discussed in the Background section is not necessarily prior art and should not be assumed to be prior art merely as a result of its discussion in the Background section. Along these lines, any recognition of problems in the prior art discussed in the Background section or associated with such subject matter should not be treated as prior art unless expressly stated to be prior art. Instead, the discussion of any subject matter in the Background section should be treated as part of the inventor's approach to the particular problem, which, in and of itself, may also be inventive.

BRIEF SUMMARY

Embodiments of the present disclosure provide a PLA that allows great flexibility in selecting clock sources. The PLA includes a plurality of programmable logic cells. A global PLA clock signal is made available to each of the logic cells. Several of the input signals of each logic cell are also made available to be used as clock signals for the logic cell. Programmers of the logic cell can select which clock signal to use for each logic cell.

In one embodiment, each logic cell includes a flip-flop that outputs a synchronized output signal of the logic cell. The flip-flop receives, on a clock input terminal, a clock signal selected during programming of the PLA. The clock signal can be the global clock signal or another selected clock signal.

In one embodiment, each logic cell includes a clock selection multiplexer. The clock selection multiplexer receives a plurality of signals that can be used as a clock signal for the logic cell. The plurality of signals can include input signals of the PLA, synchronized outputs of other logic cells of the PLA, or a generic enable signal that results in selection of the global PLA clock signal.

Embodiments of the present disclosure also provide a programmable logic block that allows flexibility in choosing one or both of simple programmable logic or complex programmable logic. The programmable logic block includes a simple PLA and a complex field programmable gate array (FPGA). The programmable logic block includes an interface coupled to both the PLA and the FPGA. A user of the logic block can program the PLA and the FPGA via the interface.

In one embodiment, the PLA includes a plurality of simple logic cells each including a multiplexer and a programmable memory. The FPGA includes a plurality of complex logic cells connected to each other by a large number of interconnections and switches. Each complex logic cell may include multiple programmable memories or other complex arrangements.

In one embodiment, a method includes receiving a plurality of input signals at a first logic cell of a PLA and receiving a global clock signal at a first input of a logic gate. The method includes receiving a selected input signal of the plurality of input signals at a second input of the logic gate and supplying a clock signal from the logic gate to a clock input terminal of a flip-flop of the first logic cell.

In one embodiment, a method includes receiving a plurality of input signals at a logic cell of a PLA and generating, with the logic cell, a direct output signal based on the plurality of input signals. The method includes generating, with the logic cell, a synchronized output signal by passing the direct output signal through a flip-flop of the logic cell and passing, to a clock-input terminal of the flip-flop, a first clock signal based on a selected input signal from the plurality of input signals.

In one embodiment, an integrated circuit includes a PLA. The PLA includes an array of logic cells. A first logic cell of the array of logic cells includes a first multiplexer configured to receive a plurality of input signals and a programmable memory coupled to the first multiplexer and configured to provide a direct output based on the plurality of input signals. The first logic cell includes a flip-flop configured to provide a synchronized output signal and a logic gate having an output coupled to a clock input terminal of the flip-flop, a first input that receives a global clock signal, and a second input that receives a selected input signal from the plurality of input signals.

In one embodiment, an integrated circuit includes a programmable logic block including a PLA, an FPGA, and an interface coupled to the array of programmable logic cells.

In one embodiment, a method includes providing first input signals to a programmable logic array of a programmable logic block of an integrated circuit and generating first output signals with the programmable logic array based on the first input signals. The method includes providing second input signals to a FPGA of the programmable logic block and generating second output signal with the FPGA based on the second input signals.

In one embodiment, a method includes providing first programming signals to an interface of a programmable logic block and providing second programming signals to the interface. The method includes configuring, with the interface, a PLA of the programmable logic block based on first programming signals and configuring, with the interface, a FPGA of the programmable logic block based on the second programming signals.

BRIEF DESCRIPTION OF THE SEVERAL VIEWS OF THE DRAWINGS

Reference will now be made by way of example only to the accompanying drawings. In the drawings, identical reference numbers identify similar elements or acts. In some drawings, however, different reference numbers may be used to indicate the same or similar elements. The sizes and relative positions of elements in the drawings are not necessarily drawn to scale. For example, the shapes of various elements and angles are not necessarily drawn to scale, and some of these elements may be enlarged and positioned to improve drawing legibility.

DETAILED DESCRIPTION

In the following description, certain specific details are set forth in order to provide a thorough understanding of various disclosed embodiments. However, one skilled in the relevant art will recognize that embodiments may be practiced without one or more of these specific details, or with other methods, components, materials, etc. In other instances, well-known systems, components, and circuitry associated with integrated circuits have not been shown or described in detail, to avoid unnecessarily obscuring descriptions of the embodiments.

Unless the context requires otherwise, throughout the specification and claims which follow, the word "comprise" and variations thereof, such as, "comprises" and "comprising" are to be construed in an open, inclusive sense, that is as "including, but not limited to." Further, the terms "first," "second," and similar indicators of sequence are to be construed as interchangeable unless the context clearly dictates otherwise.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its broadest sense, that is as meaning "and/or" unless the content clearly dictates otherwise.

Figure 1:
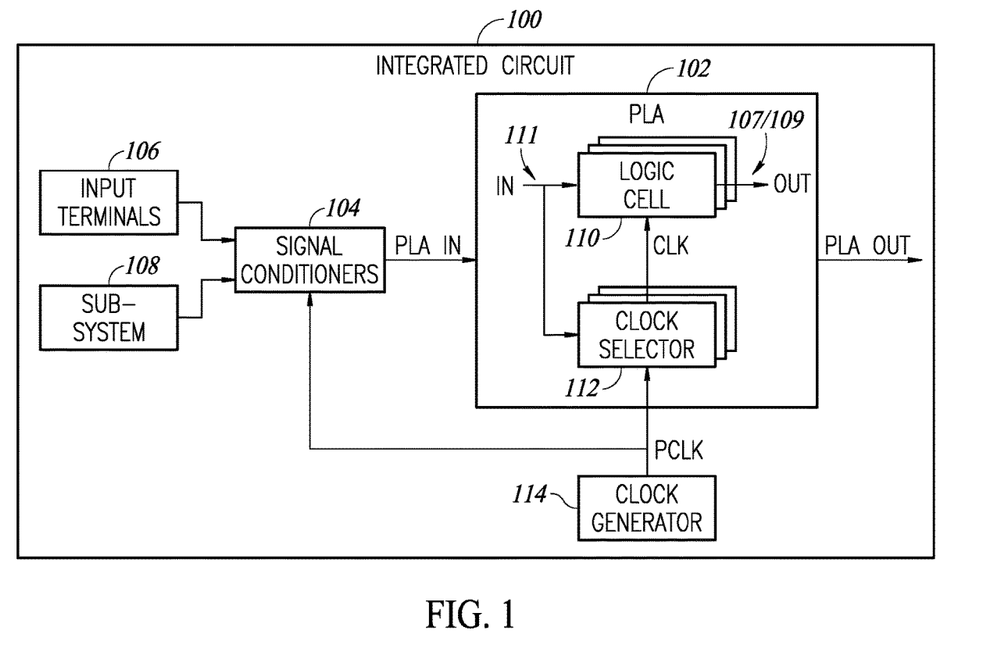
FIG. 1 is a block diagram of an integrated circuit including a PLA, according to one embodiment.

FIG. 1 is a block diagram of an integrated circuit 100, according to one embodiment. The integrated circuit 100 includes a PLA 102. As will be set forth in more detail below, the components of the PLA 102 cooperate to enable a high degree of flexibility in selecting clock signals for the PLA 102. This high degree of flexibility enables programmers of the PLA 102 greater freedom in selecting how to program the PLA 102.

In a broad sense, the PLA 102 receives PLA input signals PLA IN and outputs PLA output signals PLA OUT. The PLA 102 includes an array of programmable logic cells 110 that can be programmed to process the PLA input signals PLA IN in order to generate PLA output signals PLA OUT. Accordingly, the PLA 102 receives input signals PLA IN and outputs PLA output signals PLA OUT based on the input signals PLA IN and the logical expressions corresponding to the programming of the logic cells 110. Further details regarding the logic cells 110 are provided below.

The integrated circuit 100 includes one or more input terminals 106. The input terminals 106 are terminals by which input signals are received at the integrated circuit 100 from sources external to the integrated circuit 100. The input terminals can include input pads or other types of terminals. The input signals can be digital signals or analog signals.

The integrated circuit includes one or more subsystems 108. The one or more subsystems 108 can correspond to other functional blocks of the integrated circuit 100. The subsystems can include analog-to-digital converters, memory arrays, serial interfaces, or other types of subsystems that can generate output signals.

The integrated circuit 100 includes one or more signal conditioners 104. The signal conditioners 104 provide the PLA inputs PLA IN to the PLA 102. Each signal conditioner 104 is coupled to either an input pad 106 or a subsystem 108. The signal conditioner 104 receives an input signal and conditions the input signal for processing by the PLA 102. The outputs of the signal conditioners 104 correspond to the PLA inputs PLA IN provided to the PLA 102. Further details regarding the signal conditioners 104 are provided below.

The integrated circuit 100 includes a PLA clock generator 114. The PLA clock generator generates a PLA clock signal PCLK. The PLA clock signal PCLK may correspond to a global or default clock signal for the PLA 102. The global clock signal PCLK may also be provided to the signal conditioners 104.

The shape of the data pulses received from the subsystems 108 may be unknown. If the input data signals from the subsystems 108 are not conditioned in some way, the programmable logic array 102 may not properly process the input data signals and, thus, may generate faulty or erroneous output data. Additionally, signals or data received at the input pads 106 may have characteristics that are unknown to the integrated circuit. For example, data signals may be passed to the input pads 106 in conjunction with clocks having frequencies and phases that are not known ahead of time to the integrated circuit 100. Some of these data may be passed to the programmable logic array 102. If the input data signals are not conditioned in some way, it may be difficult for the programmable logic array 102 to process the data and generate outputs that are error-free.

The signal conditioners 104 may include circuitry for synchronizing the signals provided from the input terminals 106 and the subsystems 108 with the PLA clock signal PCLK. The signal conditioners 104 may also include filtering circuits. The filtering circuits can be programmed to filter out undesirable features in the signals received from the input terminals 106 and the subsystems 108. Accordingly, the signal conditioners 104 prepare the signals received from the input terminals 106 and subsystems 108 for effective and efficient processing by the PLA 102.

The PLA 102 includes a plurality of logic cells 110. Each logic cell 110 includes a plurality of inputs 111, a plurality of direct outputs 107, and a plurality of synchronized outputs 109. The logic cells 110 may be arranged in rows and columns. Each input 111 may receive an input signal from the input of the PLA 102, the direct outputs signals from the direct outputs 107 of the logic cells 110 of the PLA 102, and the synchronized output signals from the synchronized outputs 109 of the logic cells 110 of the PLA 102.

The PLA 102 may include synchronized interconnects corresponding to signal lines that electrically connect the synchronized outputs 109 of the logic cells 110 to the inputs 111 of the logic cells 110. In one embodiment, the synchronized interconnects may enable connecting the synchronized output of a logic cell to an input 111 of any of the logic cells 110. The PLA may include direct interconnects corresponding to signal lines that electrically connect the direct outputs 107 of the logic cells 110 to the inputs 111 of the logic cells 110. The direct and synchronized interconnects may include conductive vias, metal lines, and other metal interconnects formed in various layers of the integrated circuit 100. In some cases, the direct and synchronized interconnects may include one or more switches that can selectively connect and disconnect the direct and synchronized interconnects.

Each logic cell 110 receives a clock signal CLK. The clock signal CLK is utilized by a logic cell 110 to generate the synchronized output 109 of that logic cell 110. In one embodiment, each logic cell 110 includes a flip-flop. The synchronized output 109 is generated by passing the direct output 107 to the data input terminal of the flip-flop. The data output terminal of the flip-flop outputs the synchronized output 109. The clock input terminal of the flip-flop receives the clock signal CLK. Because the rising or falling edge of the synchronized output 109 is controlled by the rising or falling edge of the clock signal CLK, the synchronized output 109 is synchronized with the clock signal CLK. Other synchronization circuits and schemes can be utilized without departing from the scope of the present disclosure.

In some cases, it may be beneficial to enable the logic cells 110 to utilize a clock signal CLK other than the global PLA clock signal PCLK. For this reason, the PLA 102 includes a plurality of clock selectors 112. In one embodiment, there is a respective clock selector 112 for each logic cell 110. Each clock selector 112 receives the global PLA clock signal PCLK. Each clock selector 112 also receives one or more of the signals provided to the inputs 111 of the logic cell 110. As described previously, each logic cell receives a plurality of inputs including the PLA inputs PLA IN, direct outputs from other logic cells 110, and synchronized outputs from the logic cells 110. One or more of these inputs are provided to the clock selector 112. The clock selector 112 selects one of the available signals to provide to the corresponding logic cell 110. When a user programs the PLA 102, the user can program the clock selector 112 to select a desired clock signal from the available clock signals. The clock signal CLK provided to a logic cell 110 corresponds to the selected clock signal for that logic cell 110. Accordingly, it is possible that different logic cells 110 will select different signals for the clock signal CLK.

In one embodiment, each clock selector 112 includes a multiplexer. The multiplexer receives a plurality of the signals received at the inputs 111. The multiplexer also receives a control signal that determines which of the input signals will be provided at the output of the multiplexer. The output of the multiplexer may correspond to the selected clock signal CLK. Alternatively, the clock selector may utilize the output of the multiplexer to assist in generating the selected clock signal CLK.

In one embodiment, each clock selector 112 includes both a multiplexer as described above, and a logic gate. The logic gate receives the output of the multiplexer and the global PLA clock signal PCLK. The logic gate outputs a clock signal CLK based on the output of the multiplexer and a global clock signal PCLK. Accordingly, the output of the clock selector 112 may be a clock signal CLK that is based on both the global clock signal PCLK and the signal output by the multiplexer. Various other schemes for generating the clock signal CLK can be utilized without departing from the scope of the present disclosure.

Figure 2:
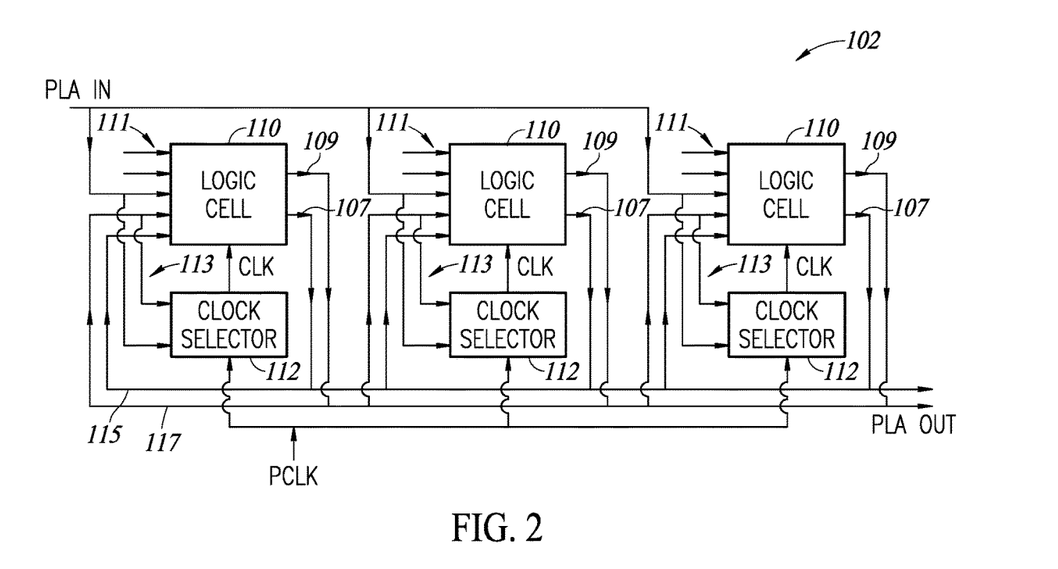
FIG. 2 is a block diagram of a portion of a PLA, according to one embodiment.

FIG. 2 is a schematic diagram of a portion of a PLA 102, according to one embodiment. While FIG. 2 illustrates a single row of three logic cells 110, in practice, the PLA 102 may include a large number of logic cells 110 arranged in rows and columns. Each of the logic cells 110 has a plurality of inputs 111. Each logic cell 110 provides a direct output 107 and a synchronized output 109. The direct outputs 107 and the synchronized outputs 109 of each logic cell 110 are utilized as input signals of the logic cells 110. The PLA 102 also receives PLA inputs PLA IN. The PLA inputs PLA IN are utilized as inputs 111 of the logic cells 110.

For simplicity, the direct outputs 107 are shown as connecting to a single interconnect line 115. In practice, the interconnect line 115 represents each of the individual interconnects that connect the direct outputs 107 to the inputs of the logic cells 110. Likewise, the synchronized outputs 109 are also shown as connecting to a single interconnect line 117. However, the interconnect line 117 represents the individual distinct synchronized outputs 109 of each of the logic cells 110. All of the direct outputs 107 and all of the synchronized outputs 109 can be utilized as PLA output signals PLA OUT.

FIG. 2 illustrates that some of the input signals 111 are provided to the clock selectors 112. In particular, one or more of the PLA inputs PLA IN and one or more of the synchronized outputs 109 are provided to the clock selectors 112. The clock selector 112 also receives the global PLA clock signal PCLK. The direct outputs 107 are not provided to the clock selectors 112.

As described previously, each clock selector 112 outputs a clock signal CLK to the corresponding logic element 110. The clock signal CLK can be generated based on one or more of the input signals provided to the clock selector 112. The clock signal CLK may correspond to the global PLA clock signal PCLK, to one of the input signals 111, or may be a signal based on the PLA clock signal PCLK and one of the inputs 111.

Figure 3:
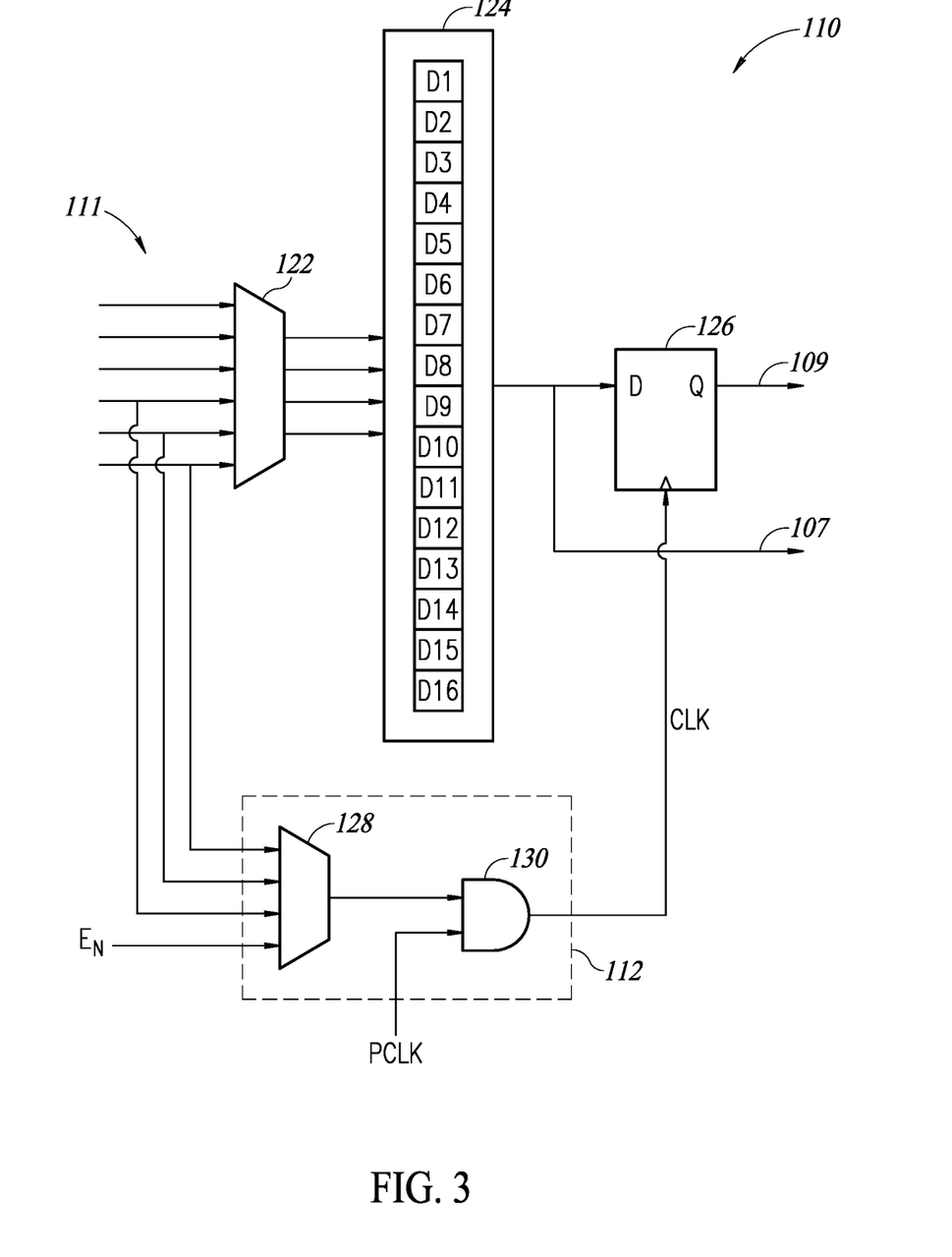
FIG. 3 is a schematic diagram of a logic cell of a PLA, according to one embodiment.

FIG. 3 is a schematic diagram of a logic cell 110 of a PLA 102, according to one embodiment. The logic cell 110 of FIG. 3 is one embodiment of a logic cell 110 that can be utilized for the logic cells 110 of FIGS. 1-2, and for subsequent figures. While FIG. 3 illustrates a specific embodiment of a logic cell 110, other configurations of logic cells 110 can be utilized without departing from the scope of the present disclosure.

The logic cells 110 includes a multiplexer 122, a memory 124, and a flip-flop 126. The input side of the multiplexer 122 correspond to the input side of a logic cell 110. In particular, the multiplexer 122 may have a plurality of inputs 111. The inputs 111 can include synchronous outputs 109 of all of the logic cells 110 of a block. The inputs 111 can include the direct outputs 107 of all of the logic cells 110. The inputs 111 can include one or more inputs of the PLA 102. In practice there may be a large number of inputs.

The multiplexer 122 provides a plurality of outputs. In the example of FIG. 3, the multiplexer 122 has four outputs. In this case, a control signal (not illustrated) is provided to the multiplexer 122 to determine which of the inputs 111 will be provided at the outputs of the multiplexer 122. The multiplexer 122 can receive other numbers of inputs and can provide other numbers of outputs that are shown in FIG. 3 without departing from the scope of the present disclosure.

In one embodiment, the memory 124 is a register with 16 data values d1-d16. Each data value may be a binary value of 0 or 1. The register outputs one of the data values d1-d16 depending on the combination of data values received from the multiplexer 122. The outputs of the multiplexer 122 effectively correspond to an address for the memory 124. If the multiplexer provides, on the four outputs, a value of 0000, then the memory 124 will output the value stored in d1. If the multiplexer provides, on the four outputs a value of 1111, then the memory 124 will output the value stored in d16. Accordingly, each four bit value received from the multiplexer 122 corresponds to one of the 16 data storage locations of the memory 124. While FIG. 3 illustrates that the memory 124 is a register, other types of memories can be utilized for logic cell 110 without departing from the scope of the present disclosure.

Programming the logic cells 110 includes selecting a value for each of the data values d1-d16 and writing the selected data values to the memory 124. Programming of the logic cells 110 can also include selecting a value for the control signal provided to the multiplexer 122. The value of the control signal determines which of the inputs 111 will be provided at the outputs of the multiplexer 122.

The logic cells 110 includes a flip-flop 126. The flip-flop 126 receives, on a data input terminal, the output of the memory 124. The data output terminal of the flip-flop 126 corresponds to the synchronized output 109 of the logic cell 110.

The logic cell 110 also includes a clock selector 112. The clock selector 112 includes a multiplexer 128 and an AND gate 130. The output of the multiplexer 128 is coupled to a first input of the AND gate 130. A second input of the AND gate 130 receives the global PLA clock signal PCLK. The output of the AND gate 130 is coupled to the input of the clock terminal of the flip-flop 126. The output of the AND gate 130 corresponds to the output of the clock selector 112.

The multiplexer 128 receives one or more of the inputs 111 of the flip-flop 122. Accordingly, some of the signals that are provided to the inputs of the multiplexer 122 are provided to the inputs of the multiplexer 128. In one embodiment, one or more of the PLA inputs PLA IN are provided to the multiplexer 128. In one embodiment, one or more of the synchronized outputs 109 that are provided to the inputs of the multiplexer 122 are also provided to the inputs of the multiplexer 128. In one embodiment, the direct outputs 107 are not provided to the inputs of the multiplexers 128. The multiplexer 128 also receives an enable signal EN.

Programming the logic cell 110 includes selecting the input of the multiplexer 128 that will be utilized as the output of the multiplexer 128. The output of the multiplexer 128 helps determine the clock signal CLK. Accordingly, a programmer of the PLA 102 is able to select from various input signals to be utilized in shaping the clock signal CLK.

The clock signal CLK is only high when the global PLA clock signal PCLK is high and when the output of the multiplexer 128 is high. Accordingly, the shape of CLK is based on both the global clock signal PCLK and the selected output of the multiplexer 128. This provides great flexibility to programmers of the PLA 102 in selecting how the synchronized output 109 of a logic cell 110 will be generated.

In one embodiment, the multiplexer 128 outputs the enable signal EN when it is desired to utilize the clock signal PCLK as the clock signal CLK. In this case, the enable signal EN is constantly in a high state such that the output of the AND gate 130 corresponds directly to the global PLA clock signal PCLK. The clock selector 112 can utilize logic gates other than AND gates without departing from the scope of the present disclosure.

Although FIG. 3 illustrates that the clock signal CLK is based on both the clock signal PCLK and a selected input signal, in practice, the clock signal CLK can be generated in other manners without departing from the scope of the present disclosure. For example, PCLK may be provided as an input to the multiplexer 128. In this case, the output of the multiplexer 128 is connected to the clock input terminal of the flip-flop 126.

Figure 4:
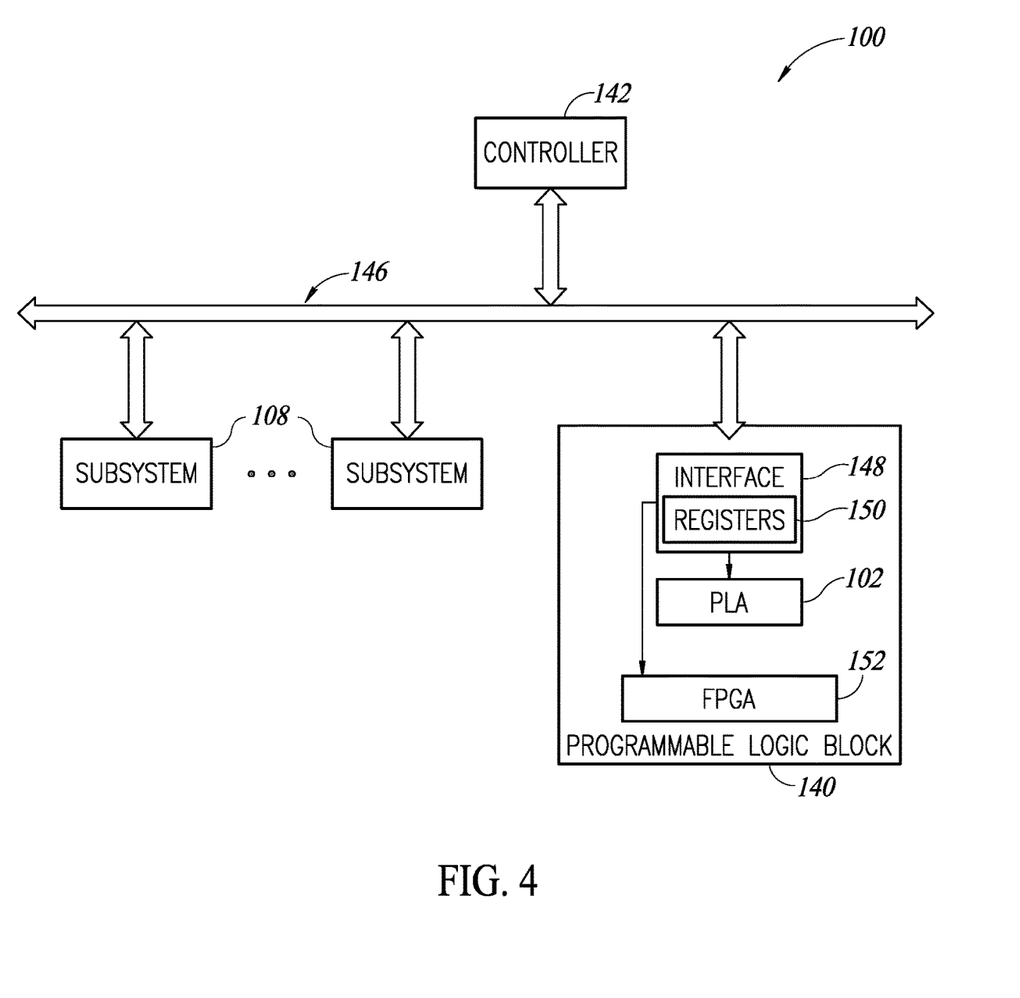
FIG. 4 is a block diagram of an integrated circuit including a programmable logic block, according to one embodiment.

FIG. 4 is a block diagram of an integrated circuit 100, according to one embodiment. The integrated circuit 100 includes a programmable logic block 140, a controller 142, and subsystems 108. The programmable logic block 140, the controller 142, and the subsystems 108 are coupled together by a bus 146. As will be set forth in more detail below, the programmable logic block 140 enables selection of either or both of the complex logic array and a simple logic array.

The programmable logic block 140 includes a PLA 102 and the FPGA 152. The PLA 102 corresponds to a simple programmable logic. The FPGA 152 corresponds to a complex programmable logic. Traditionally, an integrated circuit may include either PLA or an FPGA. However, the integrated circuit 102 includes a programmable logic block 140 that includes both a PLA 102 and an FPGA 152. This enables programmers of the programmable logic block 140 great flexibility in programming the programmable logic block 140. Programmers may utilize either or both of the PLA 102 and the FPGA 152.

The subsystems 108 can provide inputs to the programmable logic block 140. The inputs may be provided to the programmable logic block 140 via the bus 146 or via other connections. The programmable logic block 140 may also receive inputs from the controller 142. The programmable logic block 140 may also receive inputs from terminals of the integrated circuit 100. Furthermore, the programmable logic block 140 may also utilize signal conditioners 104 as described in relation to FIG. 1.

The PLA 102 of the programmable logic block 140 may correspond substantially to a PLA 102 as described in relation to FIGS. 1-3. Accordingly, the PLA 102 may include a plurality of logic cells 110. Each logic cell 110 may include a multiplexer 122, a programmable memory 124, and a flip-flop 126. Each logic cell 110 may generate a direct output 107 and the synchronized output 109, as described previously. Other types of simple logic cells and arrays of logic cells 110 can be utilized for the PLA without departing from the scope of the present disclosure.

The FPGA 152 may include an array of logic cells that is much more complex than the PLA 102. In particular, each individual logic cell may include a plurality of programmable memories coupled together by switches. The switches may also be coupled to a large number of interconnection lines. The switches of the FPGA logic cell can determine which inputs are provided to each of the programmable memories and which outputs of the programmable memories are provided from the FPGA logic cells. The FPGA may also include switching nodes coupled to the FPGA logic cells. The switching nodes control which signals are passed through a large number of interconnections between the FPGA programmable memories. Programming the FPGA can include programming the switching nodes, programming the switches of the FPGA logic cells, and writing data to the programmable memories of the FPGA logic cells.

The programmable logic block 140 includes an interface 148. The interface 148 is coupled to both the PLA 102 and the FPGA 152. The interface is coupled to the bus 146. The interface can receive signals from the bus 146 and can pass the signals to the PLA 102 and the FPGA 152. The interface can provide signals from the PLA 102 and the FPGA 152 to the bus 146.

The controller 142 can control the interface 148. In particular, the controller 142 can be utilized to program the PLA 102 and the FPGA 152 via the interface 148. Programming control signals are provided from the controller 142 to the interface 148 for programming the PLA 102 and the FPGA 152. The interface 140 may also include registers 150. The registers may store the program data for one or both of the PLA 102 and the FPGA 152. In particular, programming the PLA 102 and FPGA 152 can include writing data to the registers 150. The data in the registers 150 controls the programming of the FPGA 152 and the PLA 102. The data written to the registers 150 can indicate when data is written to the logic cells 110 of the PLA 102 and which signals are utilized by the multiplexers of the logic cells 110 of the PLA 102. Though not shown in FIG. 4, input terminals 106 may also be coupled to the bus 146 via registers for providing input signals to the programmable logic block 140.

Figure 5:
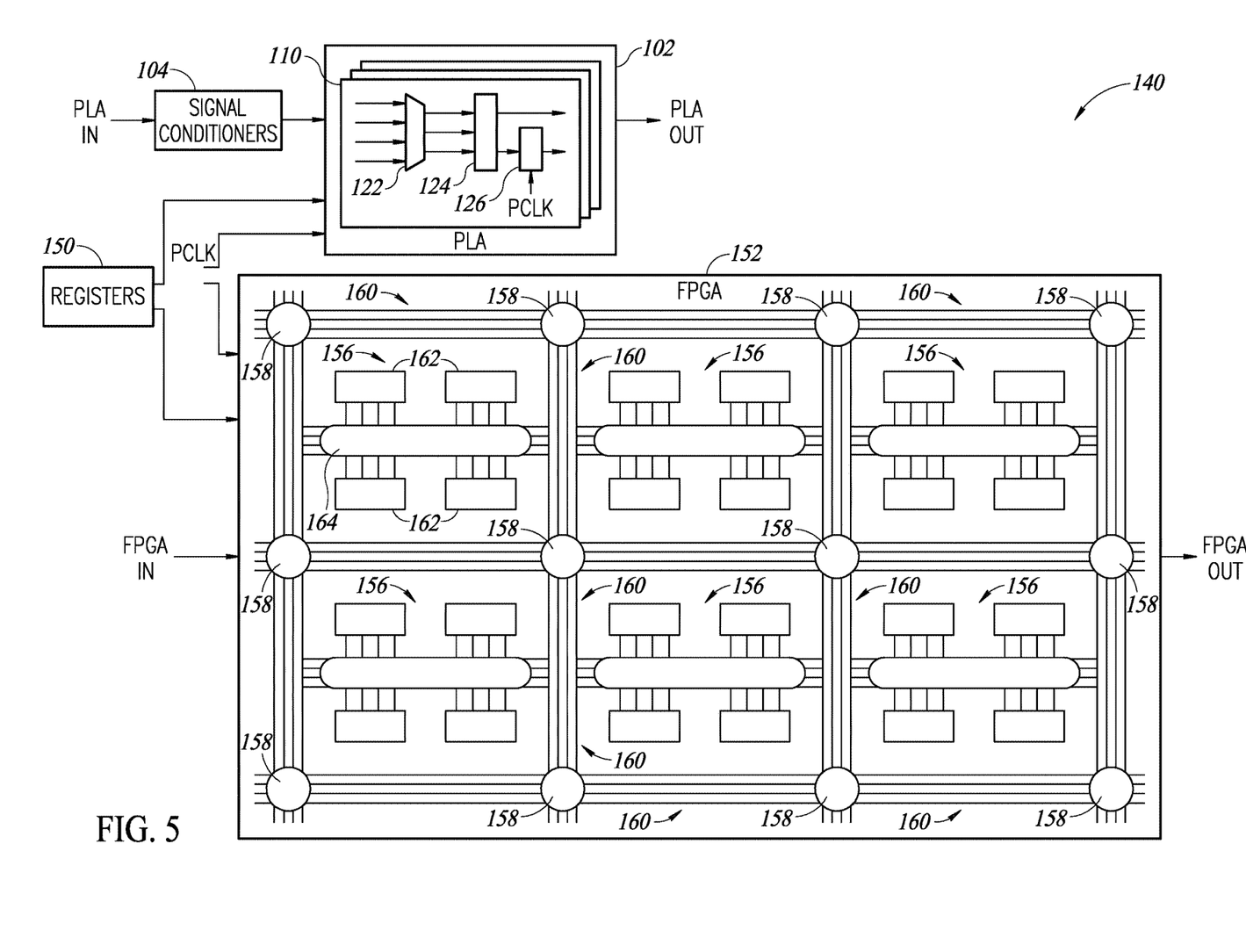
FIG. 5 is a block diagram of a programmable logic block including a PLA and a FPGA, according to one embodiment.

FIG. 5 is a schematic diagram of a programmable logic block 140, according to one embodiment. The programmable logic block 140 of FIG. 5 is one example of a programmable logic block 140 of FIG. 4. The programmable logic block 140 includes a PLA 102 and an FPGA 152.

The PLA 102 includes a plurality of logic cells 110. Each logic cell 110 includes a multiplexer 122, a programmable memory 124, and a flip-flop 126. Each logic cell 110 can operate substantially as described in relation to FIGS. 1-3.

The FPGA 152 includes a plurality of logic cells 156. The logic cells 156 are connected to each other by interconnections 160. The interconnections 160 extends between switches 158. Each switch 158 may correspond to a group of switches. Signals are passed between the logic cells 156 through the interconnections 160. The switches 158 control the connections between logic cells 156. Interconnections 160 pass output signals from one logic cell 156 as input signals to other logic cells 156. Programming of the FPGA 152 can include which switches 158 will be open and which switches 158 will be closed.

Each logic cell 156 includes multiple programmable memories 162. Each programmable memory 162 may be substantially similar to the programmable memories 124 of the logic cells 110. In one example, each programmable memory 162 is a lookup table including a selected number of data values. Input signals are provided to the programmable memories 162. The programmable memories 162 output data values based on the values of the input signals provided to them. Though not shown in FIG. 5, each logic cell may also include a respective multiplexer upstream from each lookup table 156.

Each logic cell 156 includes a switch 164. In practice, the switch 164 of each logic cell 156 represents a plurality of switches. The switches 164 determine which input signals are provided to the programmable memories 156 and which output signals are passed from the programmable memories 156. Various other configurations of FPGA logic cells 156, interconnections 160 and switches 158 and 164can be utilized without departing from the scope of the present disclosure.

The architecture of the FPGA 152 is substantially more complex than the architecture of the PLA 102. As one example, each logic cell 156 of the FPGA includes multiple programmable memories 162 and multiple switches 164 that can be programmed to provide complex interconnections schemes to the programmable memories 162 and to the other logic cells 156. In contrast, each logic cell 110 of the PLA 102 includes only a single programmable memory 124 and multiplexer 122 that provides input signals to the programmable memory 124.

The PLA input signals PLA IN can include signals provided from the bus 146 to the PLA 102. In particular, input signals PLA IN can be passed via the bus 146 to the interface 148 of the programmable logic block 140 (see FIG. 4). The input signals PLA IN are then passed through signal conditioners 104 and on to the PLA 102. The PLA 102 outputs PLA output signals PLA OUT. The PLA output signals PLA OUT can be passed to the bus 146 via the interface 148.

The FPGA 152 receives FPGA input signals FPGA IN. The FPGA input signals FPGA IN can include signals provided from the bus 146 to the FPGA 152 via the interface 148. Though not shown in FIG. 5, there may be additional signal conditioners that process the FPGA input signals FPGA IN before passing into the FPGA 152. The FPGA input signals FPGA IN can include signals from input terminals of the integrated circuit 100 and from other subsystems 108 of the integrated circuit 100. The FPGA 152 outputs FPGA output signals FPGA OUT after processing the FPGA input signals FPGA IN in accordance with the programmed logic of the FPGA 152.

The PLA 102 and the FPGA 152 can be programmed via the controller 142. The controller 142 can pass programming signals or data to the interface 148. The interface 148 programs the PLA 102 and the FPGA 152 in accordance with the programming signals. Programming the PLA 102 can include configuring registers 150 of the interface 148. The values written to the registers 150 determine the program logic of the PLA 102. The FPGA 152 may be programmed in a similar manner or in a different manner. In one embodiment, the FPGA 152 is programmed by passing the single bit stream of programming data to the FPGA to configure the data values in the programmable memories 162 and to configure the switches 158 and 164. In one embodiment, the FPGA 152 can be programmed by configuring registers 150. The interface 148 may include first registers dedicated to the PLA 102 and second registers dedicated to the FPGA 152. Beneficially, a single interface 148 can be utilized to access and program both the PLA 102 and the FPGA 152.

The FPGA 152 may receive the global PLA clock signal PCLK. Alternatively, the FPGA 152 may receive different clock signals. The PLA 102 can include clock selectors 112 as described in relation to FIGS. 1-3. The FPGA 152 may also include circuitry for enabling flexible selection of clock signals.

Figure 6:
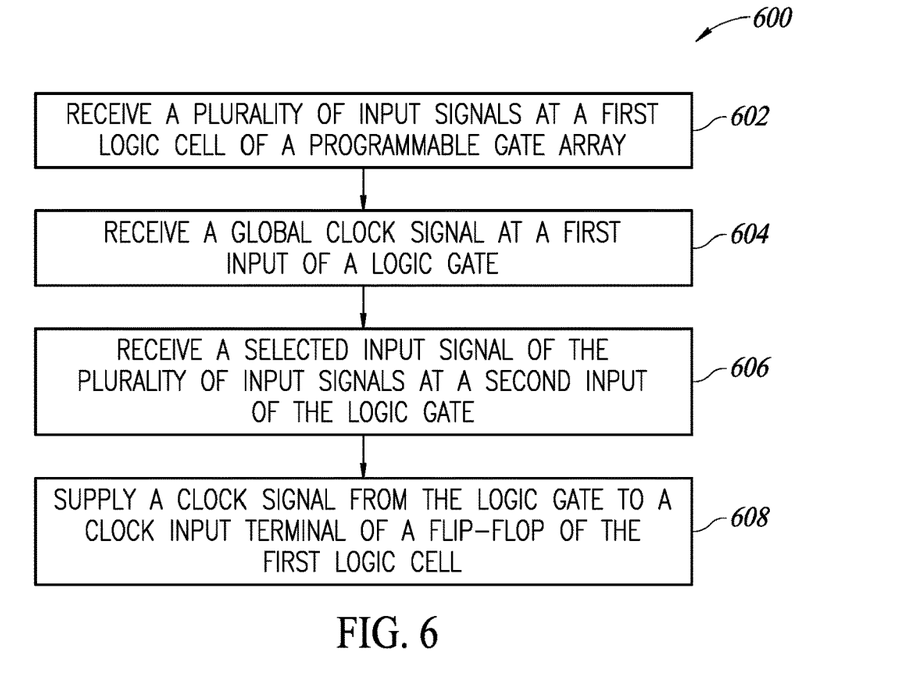
FIG. 6 is a flow diagram of method for operating an integrated circuit, according to one embodiment.

FIG. 6 is a flow diagram of a method 600 for operating an integrated circuit. The method 600 can utilize processes, systems, and components described in relation to FIGS. 1-5. At 602, the method 600 includes receiving a plurality of input signals at a first logic cell of a programmable logic array. At 604, the method 600 includes receiving a global clock signal at a first input of a logic gate. At 606, the method 600 includes receiving a selected input signal of the plurality of input signals at a second input of the logic gate. At 608, the method 600 includes supplying a clock signal from the logic gate to a clock input terminal of a flip-flop of the first logic cell.

Figure 7:
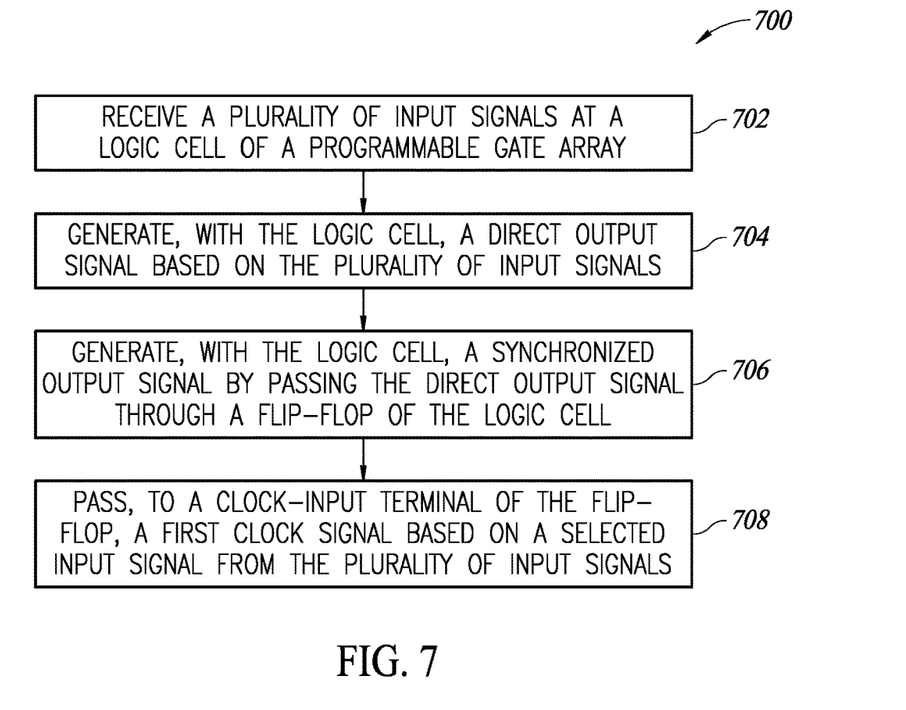
FIG. 7 is a flow diagram of method for operating an integrated circuit, according to one embodiment.

FIG. 7 is a flow diagram of a method 700 for operating an integrated circuit. The method 700 can utilize processes, systems, and components described in relation to FIGS. 1-5. At 702, the method 700 receiving a plurality of input signals at a logic cell of a programmable logic array. At 704, the method 700 includes generating, with the logic cell, a direct output signal based on the plurality of input signals. At 706, the method 700 includes generating, with the logic cell, a synchronized output signal by passing the direct output signal through a flip-flop of the logic cell. At 708, the method includes passing, to a clock-input terminal of the flip-flop, a first clock signal based on a selected input signal from the plurality of input signals.

Figure 8:
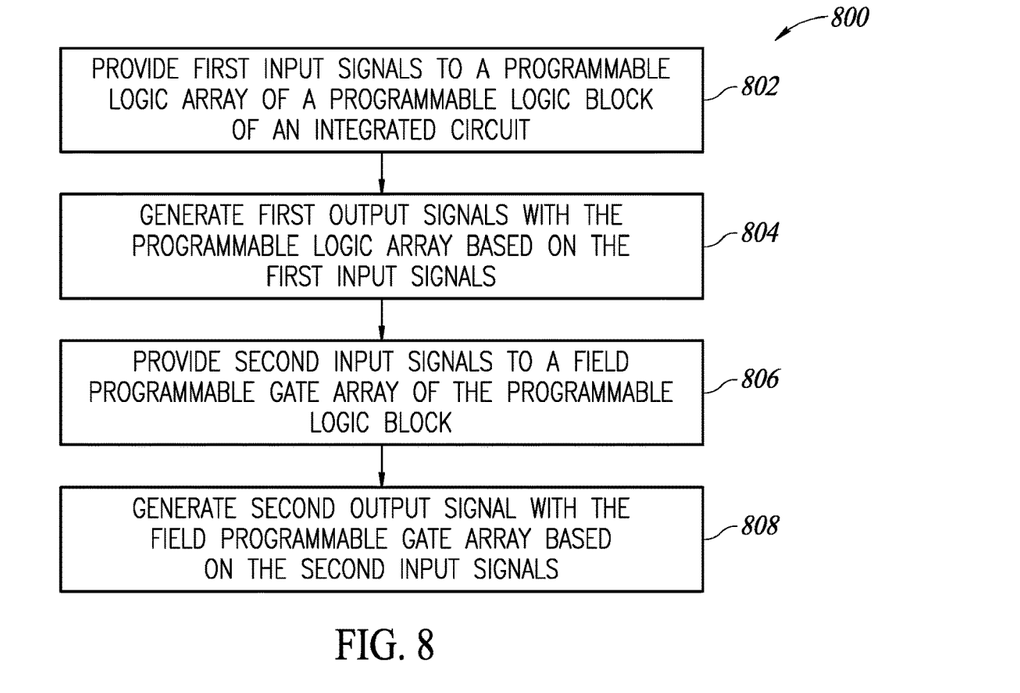
FIG. 8 is a flow diagram of method for operating an integrated circuit, according to one embodiment.

FIG. 8 is a flow diagram of a method 800 for operating an integrated circuit. The method 800 can utilize processes, systems, and components described in relation to FIGS. 1-5. At 802, the method 800 includes providing first input signals to a programmable logic array of a programmable logic block of an integrated circuit. At 804, the method 800 includes generating first output signals with the programmable logic array based on the first input signals. At 806, the method 800 includes providing second input signals to a field programmable gate array of the programmable logic block. At 808, the method 800 includes generating second output signal with the field programmable gate array based on the second input signals.

Figure 9:
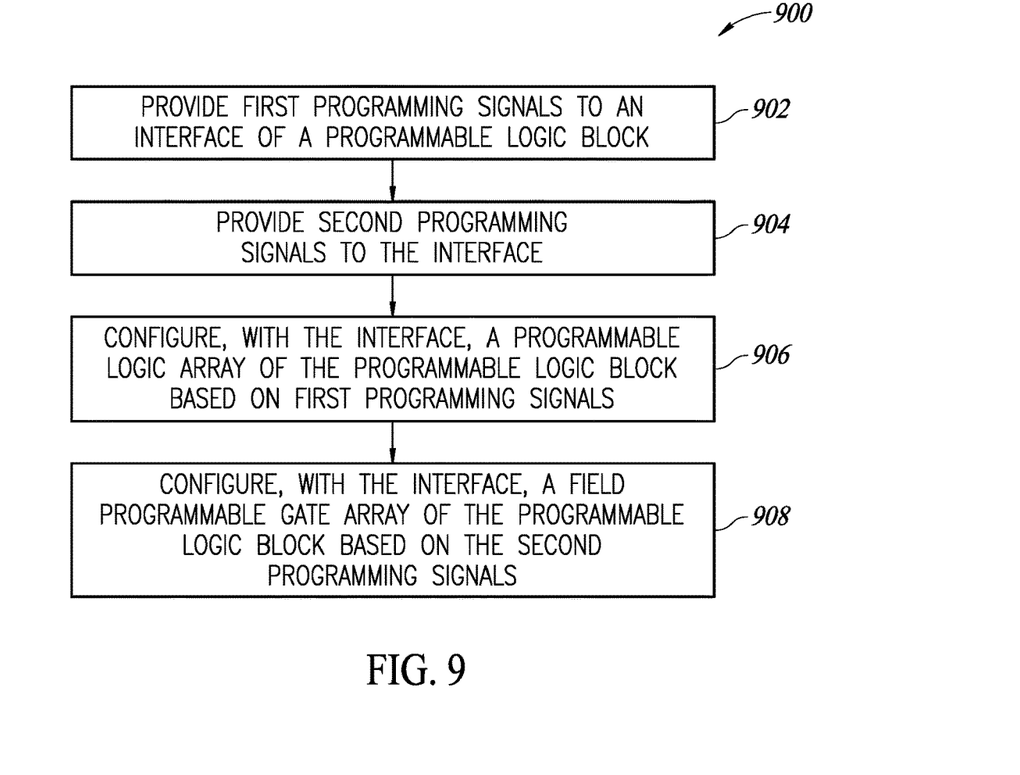
FIG. 9 is a flow diagram of method for operating an integrated circuit, according to one embodiment.

FIG. 9 is a flow diagram of a method 900 for operating an integrated circuit. The method 900 can utilize processes, systems, and components described in relation to FIGS. 1-5. At 902, the method 900 providing first programming signals to an interface of a programmable logic block. At 904, the method 900 includes providing second programming signals to the interface. At 906, the method 900 includes configuring, with the interface, a programmable logic array of the programmable logic block based on first programming signals. At 908, the method 900 includes configuring, with the interface, a field programmable gate array of the programmable logic block based on the second programming signals.

In one embodiment, a method includes receiving a plurality of input signals at a first logic cell of a PLA and receiving a global clock signal at a first input of a logic gate. The method includes receiving a selected input signal of the plurality of input signals at a second input of the logic gate and supplying a clock signal from the logic gate to a clock input terminal of a flip-flop of the first logic cell.

In one embodiment, a method includes receiving a plurality of input signals at a logic cell of a PLA and generating, with the logic cell, a direct output signal based on the plurality of input signals. The method includes generating, with the logic cell, a synchronized output signal by passing the direct output signal through a flip-flop of the logic cell and passing, to a clock-input terminal of the flip-flop, a first clock signal based on a selected input signal from the plurality of input signals.

In one embodiment, an integrated circuit includes a PLA. The PLA includes an array of logic cells. A first logic cell of the array of logic cells include a first multiplexer configured to receive a plurality of input signals and a programmable memory coupled to the first multiplexer and configured to provide a direct output based on the plurality of input signals. The first logic cell includes a flip-flop configured to provide a synchronized output signal and a logic gate having an output coupled to a clock input terminal of the flip-flop, a first input that receives a global clock signal, and a second input that receives a selected input signal from the plurality of input signals.

In one embodiment, an integrated circuit includes a programmable logic block including a PLA, an FPGA, and an interface coupled to the array of programmable logic cells.

In one embodiment, a method includes providing first input signals to a programmable logic array of a programmable logic block of an integrated circuit and generating first output signals with the programmable logic array based on the first input signals. The method includes providing second input signals to a FPGA of the programmable logic block and generating second output signal with the FPGA based on the second input signals.

In one embodiment, a method includes providing first programming signals to an interface of a programmable logic block and providing second programming signals to the interface. The method includes configuring, with the interface, a PLA of the programmable logic block based on first programming signals and configuring, with the interface, a FPGA of the programmable logic block based on the second programming signals.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
    receiving a plurality of input signals at a first multiplexer of first logic cell of a programmable logic array;
    providing a subset of the plurality of input signals to a second multiplexer;
    receiving a global clock signal at a first input of an AND gate;
    receiving a selected input signal of the plurality of input signals at a second input of the AND gate;
    outputting the selected input signal from the multiplexer to a second input of the AND gate, and
    supplying a clock signal from the AND gate to a clock input terminal of a flip-flop of the first logic cell.

2. The method of claim 1, wherein the subset of input signals includes one or more signals received from a source external to the programmable logic array.

3. The method of claim 1, comprising receiving at least one of the input signals of the subset of input signals from an output of a second logic cell of the programmable logic array.

4. The method of claim 1, wherein each of the input signals of the subset of input signals is synchronized with the global clock signal.

5. The method of claim 4, wherein one or more of the input signals is a direct output signal received from a second logic cell of the programmable logic array.

6. The method of claim 1, comprising:
outputting, from the first logic cell, a direct output signal; and
outputting from the first logic cell, a synchronized output signal by passing the direct output signal through the flip-flop.

7. A method, comprising:
receiving a plurality of input signals at a logic cell of a programmable logic array;
generating, with the logic cell, a direct output signal based on the plurality of input signals;
generating, with the logic cell, a synchronized output signal by passing the direct output signal through a flip-flop of the logic cell;
generating a first clock signal, including:
receiving a global clock signal at a first input terminal or an AND gate;
receiving a selected input signal input from the plurality of input signals at a second input terminal of the AND gate; and
outputting the first clock signal from an output terminal of the AND gate; and
passing, to a clock-input terminal of the flip-flop, the first clock signal.

8. The method of claim 7, comprising:
providing a subset of the input signals to a first multiplexer; and
outputting, from the first multiplexer, the selected input signal to the second input terminal of the AND gate.

9. The method of claim 8, wherein receiving the plurality of input signals includes receiving the plurality of input signals at a second multiplexer.

10. The method of claim 9, comprising passing one or more of the input signals from the second multiplexer to a programmable memory of the logic cell.

11. The method of claim 8, wherein one or more input signals of the subset of input signals are received from a source external to the programmable logic array.

12. The method of claim 8, wherein one or more input signals of the subset of input signals are received from a second logic cell of the programmable logic array.

13. An integrated circuit, comprising a programmable logic array, the programmable logic array including:
an array of logic cells, a first logic cell of the array of logic cells including:
a first multiplexer configured to receive a plurality of input signals;
a programmable memory coupled to the first multiplexer and configured to provide a direct output based on the plurality of input signals; and
a flip-flop configured to provide a synchronized output signal;
an AND gate having an output coupled to a clock input terminal of the flip-flop, a first input that receives a global clock signal, and a second input that receives a selected input signal from the plurality of input signals; and
a second multiplexer coupled to receive a subset of the plurality of input signals and to output the selected input signal to the second input of the AND gate.

14. The integrated circuit of claim 13, wherein one or more of the input signals are received from a source external to the programmable logic array.

15. The integrated circuit of claim 13, wherein one or more input signals are received from a second logic cell of the programmable logic array.

16. The method of claim 7, comprising:
outputting, from the logic cell, a direct output signal; and
outputting from the logic cell, a synchronized output signal by passing the direct output signal through the flip-flop.

* * * * *

UNITED STATES PATENT AND TRADEMARK OFFICE
CERTIFICATE OF CORRECTION

| | | |
|---|---|---|
| PATENT NO. | : 11,942,935 B2 | Page 1 of 1 |
| APPLICATION NO. | : 17/861067 | |
| DATED | : March 26, 2024 | |
| INVENTOR(S) | : Mark Wallis et al. | |

It is certified that error appears in the above-identified patent and that said Letters Patent is hereby corrected as shown below:

In the Claims

Column 12, Claim 1, Line 50:
"of first logic cell" should read: --of a first logic cell--.

Column 13, Claim 7, Line 24:
"or an AND gate;" should read: --of an AND gate;--.

Column 13, Claim 7, Line 25:
"input signal input from the" should read: --input signal from the--.

Signed and Sealed this
Fourth Day of June, 2024

Katherine Kelly Vidal
*Director of the United States Patent and Trademark Office*